United States Patent
Tsao et al.

(10) Patent No.: US 7,208,404 B2
(45) Date of Patent: Apr. 24, 2007

(54) METHOD TO REDUCE RS PATTERN DEPENDENCE EFFECT

(75) Inventors: Jung-Chih Tsao, Hsin-Chu (TW); Chi-Wen Li, Hsinchu (TW); Kei-Wei Chen, Yonghe (TW); Jye-Wei Hsu, Hsinchu (TW); Hsien-Pin Fong, Yonghe (TW); Steven Lin, Taipei (TW); Ray Chuang, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 87 days.

(21) Appl. No.: 10/687,183

(22) Filed: Oct. 16, 2003

(65) Prior Publication Data

US 2005/0085066 A1   Apr. 21, 2005

(51) Int. Cl.
    *H01L 21/4763* (2006.01)
(52) U.S. Cl. ............ 438/618; 438/633; 438/687; 257/E23.141; 257/E21.59
(58) Field of Classification Search ........... 438/618, 438/633, 638, 687, FOR. 355, FOR. 489; 257/E23.141, E21.59
See application file for complete search history.

(56) References Cited

U.S. PATENT DOCUMENTS

| | | | |
|---|---|---|---|
| 5,674,787 A | 10/1997 | Zhao et al. ........... | 437/230 |
| 6,093,656 A * | 7/2000 | Lin ................. | 438/734 |
| 6,224,737 B1 | 5/2001 | Tsai et al. ............ | 205/123 |
| 6,225,223 B1 | 5/2001 | Liu et al. ............. | 438/687 |
| 6,228,771 B1 | 5/2001 | Allers ............... | 438/692 |
| 6,350,364 B1 | 2/2002 | Jang ................ | 205/118 |
| 6,376,369 B1 * | 4/2002 | Doan ............... | 438/643 |
| 6,420,258 B1 | 7/2002 | Chen et al. ........... | 438/622 |
| 6,524,947 B1 | 2/2003 | Subramanian et al. .... | 438/637 |
| 6,534,116 B2 | 3/2003 | Basol ............... | 427/97 |
| 6,569,756 B1 * | 5/2003 | Sugai ............... | 438/618 |

\* cited by examiner

*Primary Examiner*—Michelle Estrada

(57) ABSTRACT

A method of forming a copper interconnect in an opening within a pattern is described. The copper interconnect has an Rs that is nearly independent of opening width and pattern density. A first copper layer having a concave upper surface and thickness $t_1$ is formed in a via or trench in a dielectric layer by depositing copper and performing a first CMP step. A second copper layer with a thickness $t_2$ where $t_2 \leq t_1$ and having a convex lower surface is deposited on the first copper layer by a selective electroplating method. The first and second copper layers are annealed and then a second CMP step planarizes the second copper layer to become coplanar with the dielectric layer. The invention is also a copper interconnect comprised of the aforementioned copper layers where the first copper layer has a grain density $(G_{D1}) \geq G_{D2}$ for the second copper layer.

20 Claims, 6 Drawing Sheets

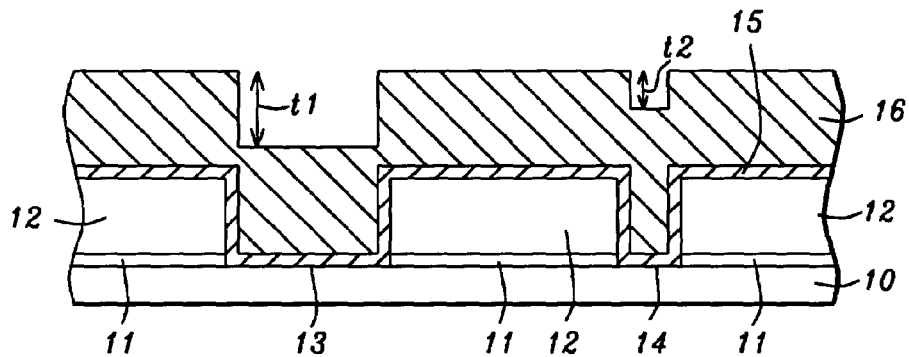
FIG. 1 - Prior Art
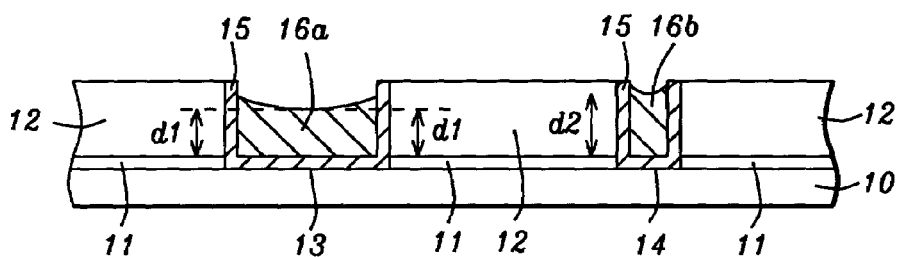
FIG. 2 - Prior Art
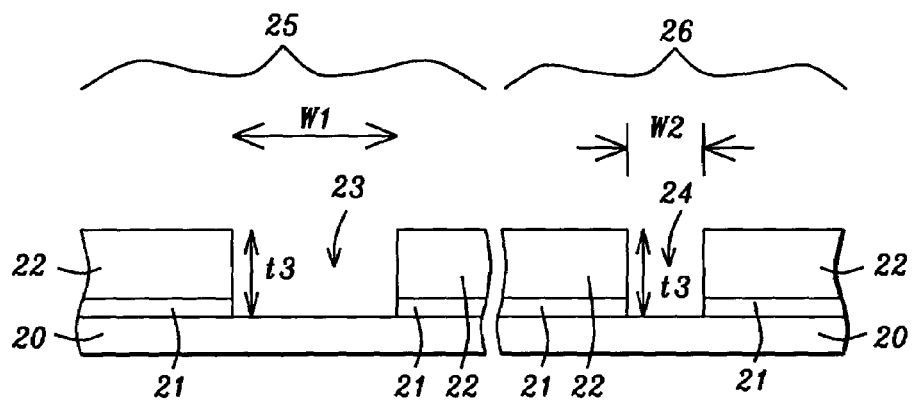
FIG. 3

METHOD TO REDUCE RS PATTERN DEPENDENCE EFFECT

FIELD OF THE INVENTION

The invention relates to a method of fabricating copper interconnects with improved performance and in particular to a method of forming a plurality of interconnects having different widths and varying pattern densities but with a similar thickness so that sheet resistance (Rs) variation is minimized.

BACKGROUND OF THE INVENTION

Integrated circuits in a semiconductor device are comprised of metal wiring that is insulated by one or more dielectric layers to prevent capacitance coupling or crosstalk between the electrical pathways. Metal wiring that forms interlevel and intralevel connections which are commonly referred to as interconnects is frequently formed by depositing a metal in an opening such as a via hole or a trench in a single damascene approach or in a trench and via simultaneously in a dual damascene scheme. Usually, a diffusion barrier layer is formed on the sidewalls of the dielectric layer adjacent to the via and/or trench before metal deposition to protect the metal from corrosion and oxidation and to prevent metal ions from migrating into the dielectric layer. The metal layer is typically planarized by a chemical mechanical polish (CMP) process that removes excess metal above the dielectric layer and lowers the metal layer so that it is coplanar with the dielectric layer.

Recent progress in forming metal interconnects includes lowering the resistivity of the metal by replacing aluminum with copper, decreasing the width of the vias and trenches with improved lithographic materials and processes to improve speed and performance, and reducing the dielectric constant (k) of dielectric layers to minimize capacitance coupling between the metal interconnects. Current technology involves forming vias and trenches which have a width that varies from less than 1 micron to over 10 microns. Although $SiO_2$ which has a dielectric constant of about 4 has been widely used as a dielectric layer in older technologies, low k dielectric layers with a k value of less than about 3 are being implemented in new devices.

It should be noted that as the width of via holes or trench openings is shrinking in new technologies, the difficulty in forming a thin diffusion barrier layer with a uniform thickness has resulted in adopting new techniques that include atomic layer deposition (ALD) which can provide improved step coverage compared with conventional ionized metal plasma (IMP) or physical vapor deposition (PVD) methods. ALD also has the advantage of providing a diffusion barrier layer with a more controlled and flexible composition but is usually limited to forming layers with a thickness of about 100 Angstroms or less due to throughput constraints.

One concern associated with a Cu CMP process is that copper is soft and is removed faster than adjacent layers by the abrasive action of the polishing pad and slurry. A high polishing rate often leads to dishing or a dent in the copper surface so that the Cu level is below the surface of a surrounding dielectric layer. Dishing is unacceptable because the cross-sectional area of a copper line is related to Rs and dishing causes Rs variations that detract from device performance. Dishing is more likely to occur in patterns with a high metal density. For example, copper lines in high density patterns where the lines comprise about 40% or more of the surface area are more susceptible to dishing than copper lines in low density patterns where the metal comprises less than about 30% of the surface area.

Another example of dishing caused by Cu CMP is in a pattern that includes both a thin copper line and a wide copper line. A conventional damascene process is depicted in FIGS. 1–2. As shown in FIG. 1, a substrate 10 is provided which typically has conductive and dielectric layers that are not shown in order to simplify the drawing. An optional etch stop layer 11 is deposited by a chemical vapor deposition (CVD) or plasma enhanced CVD method. A dielectric layer 12 that is $SiO_2$ or preferably a low k dielectric material is formed on the etch stop layer 11 by a CVD or spin-on process. A cap layer (not shown) may be deposited on the dielectric layer 12. Next, a pattern comprised of a wide trench 13 and a narrow trench 14 is formed in the dielectric layer 12 and etch stop layer 11 by a standard photoresist imaging and etching sequence. A diffusion barrier layer 15 is typically formed in the trenches 13, 14 and on the dielectric layer 12 by a PVD, IMP, or ALD technique. Then, a copper layer 16 is deposited by an electroplating method, for example. Note that the step height (t1) in the copper layer 16 is higher over the wide trench 13 than the step height (t2) over the narrow trench 14.

Referring to FIG. 2, a subsequent CMP step removes the copper layer 16 and diffusion barrier layer 15 above the dielectric layer 12. A copper layer 16a having a thickness d1 is formed in the wide trench 13 and a copper layer 16b with a thickness d2 is formed in the narrow trench 14 where d2>d1. The copper layer 16a is thinner than copper layer 16b even though both trenches 13, 14 were completely filled with copper before the CMP step. Although dishing has occurred on both copper layers 16a, 16b, the effect is more pronounced on the wider copper layer 16a. There is currently no useful method in manufacturing to correct the non-planarity of the copper layers 16a, 16b. As a result, the copper layer 16a has an unacceptably high Rs value and the Rs for the copper layer 16a is significantly larger than the Rs for the copepr layer 16b which will lead to device reliability and performance issues.

A recent advance in copper deposition as described in U.S. Pat. No. 6,420,258 involves a selective growth of copper by an electrochemical method on a conformal seed layer in a trench. The method reduces non-uniformity in metal CMP and thereby minimizes dishing at the top of a copper interconnect. However, the first CMP step that is used to remove the seed layer on the surface of the substrate can be difficult to control since the underlying diffusion barrier layer is frequently too thin to function as a good CMP stop.

A two step CMP process is described in U.S. Pat. No. 6,228,771 to minimize dishing of metal lines. Initially, a high pad pressure of 3 to 8 psi is used to remove a substantial portion of a metal layer and then a second step with a lower pad pressure removes the remaining metal layer above a dielectric layer. However, the method does not address a Rs nonuniformity problem associated with different metal pattern densities or different metal widths in the same layer.

A copper deposition process that involves two electroplating steps is provided in U.S. Pat. No. 6,350,364. The second electroplating step employs a lower ratio of leveler concentration/brightener concentration than the first step and thereby affords a thinner and more planar copper layer. As a result, copper polish time is decreased and there is more uniformity in the copper lines. Only the first copper layer remains on the substrate.

Another method of minimizing the amount of CMP dishing is described in U.S. Pat. No. 6,225,223 where a first copper layer is planarized by a first CMP step to give a small amount of dishing in a via or trench. Then a selective electroplating process deposits a second Cu layer on the first copper surface. A second CMP step forms an essentially flat second copper layer that is coplanar with an adjacent dielectric layer. However, the method does not address the effect of different pattern densities or trench width variations on Rs.

Therefore, an improved method of forming copper interconnects is needed which affords a uniform copper thickness that is independent of pattern (metal) density and the width of the copper lines in a pattern.

SUMMARY OF THE INVENTION

An objective of the present invention is to provide an improved method for fabricating copper wiring that produces a Rs value which is nearly independent of copper line width or pattern density.

A further objective of the present invention is to provide an improved method of forming copper wiring without dishing in order to prevent undesirably high Rs values that are common for wide interconnects.

A still further objective of the present invention is to provide an interconnect comprised of two copper layers in which a thicker first copper layer is formed on the bottom of an opening in a dielectric layer and a thinner second copper layer on the first copper layer forms a good interface with the first copper layer and has a smooth top surface that is coplanar with the top of the opening.

These objectives are achieved by providing a substrate on which an etch stop layer and a dielectric layer have been sequentially deposited. Conventional imaging and etching techniques are used to form a pattern comprised of openings in the dielectric layer that extend through the etch stop layer. A conformal diffusion barrier layer is deposited on the sidewalls and bottoms of the openings. A thin copper seed layer is preferably formed on the diffusion barrier layer. Next, a first copper layer that fills the openings is deposited on the diffusion barrier layer with an electroplating process and incorporates the copper seed layer. The first copper layer is polished with a first CMP step that removes the first copper layer and diffusion barrier layer above the dielectric layer to produce a first copper layer with a concave upper surface in each opening.

Because there are typically different pattern densities of openings across a substrate, the nature of the first electroplating process and first CMP step leads to a nonuniformity in the first copper layer thickness. In one embodiment, a region of high pattern density is formed by openings of equivalent size that are grouped together such that the collective surface area of the openings is greater than about 35% of the total surface area in the region. A second region with a low pattern density is formed by equivalent sized openings that are grouped together such that the collective surface area of the openings is less than about 30% of the total surface area of the region.

In a second embodiment, a high pattern density region is formed by one or more wide openings with a collective surface area that is greater than about 35% of the total surface area of the region. A low pattern density region is formed by one or more narrow openings with a collective surface area that is less than about 30% of the total surface area of the region.

A first copper layer in a region of high pattern density is thinner than a first copper layer in a region with low pattern density. To solve this nonuniformity problem, a second copper layer is deposited on the first copper layer by a selective electroplating process which fills the openings and forms a dome shape above the openings. An anneal process is employed to ensure a good interface between the first and second copper layers and to promote a more uniform copper grain size in the second copper layer. A second CMP step which is an oxide buffing process is used to planarize the second copper layer which becomes coplanar with the adjacent dielectric layer. The combined thickness of the first and second copper layers is nearly independent of pattern density and copper linewidth and thereby affords a more uniform Rs across the substrate.

The present invention is also a copper interconnect structure formed in an opening such as a trench, a via, or a trench formed above a via. The copper interconnect is comprised of a first copper layer having a first thickness ($t_1$) and grain density ($G_{D1}$) with vertical sidewalls, a planar bottom and a concave upper surface and a second copper layer with a second thickness ($t_2$) and grain density $G_{D2}$ where $t_1 \geq t_2$ and $G_{D1} \geq G_{D2}$.

The second copper layer has vertical sidewalls, a width equivalent to the width of the first copper layer, a substantially planar top surface and a convex bottom surface that forms a smooth interface with the concave upper surface of the first copper layer. Furthermore, the opening may have a conformal lining comprised of a copper seed layer formed on a diffusion barrier layer. In this case, the copper seed layer is incorporated into the first copper layer and is not distinguishable from the first copper layer. The interface between the first and second copper layers intersects a sidewall of the opening at a point that is located at or slightly below the top of the dielectric layer.

BRIEF DESCRIPTION OF THE DRAWINGS

The object and other advantages of this invention are best described in the preferred embodiments with reference to the attached drawings that include:

FIGS. 1–2 which are cross-sectional views depicting a prior art method of forming a copper layer in an opening and planarizing the copper layer to yield an interconnect.

FIGS. 3–7 which are cross-sectional views illustrating the progressive stages of a damascene scheme in which copper interconnects of different pattern densities are formed according to one embodiment of the present invention.

DETAILED DESCRIPTION OF THE INVENTION

Figure 4:
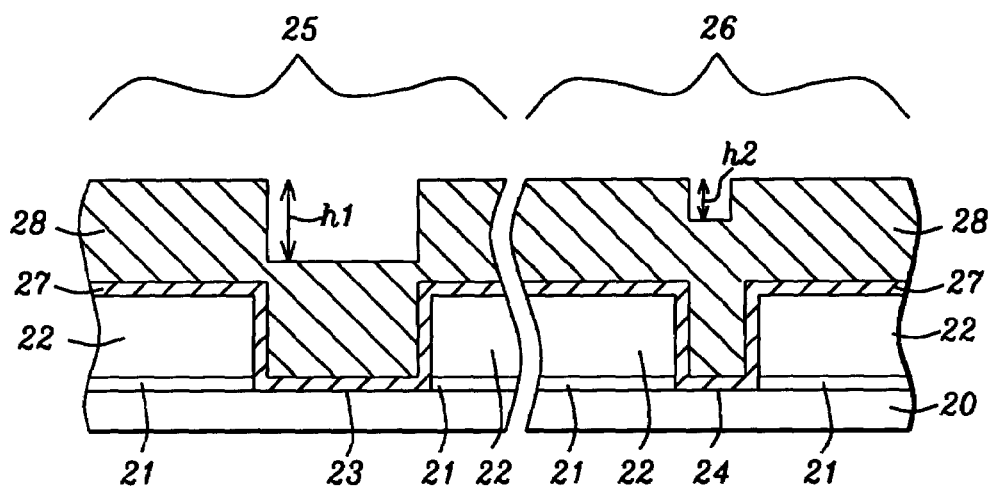

The present invention is a method that is particularly useful in forming copper interconnects with improved Rs uniformity and thickness. Although the drawings relating to the first embodiment depict a single damascene scheme, the present invention is also applicable to a dual damascene fabrication sequence. Moreover, the method of the present invention may be repeated a plurality of times on the same substrate to form a succession of copper interconnect layers that are arranged in a stacked design as is appreciated by those skilled in the art. The drawings are provided as examples only and are not intended to limit the scope of the invention.

A first embodiment is depicted in FIGS. 3–7. Referring to FIG. 3, a substrate 20 is provided that typically includes active and passive devices as well as conductive and dielectric layers that are not shown in order to simplify the drawing. Substrate 20 is preferably silicon but may also be based on silicon-germanium, gallium-arsenide, or silicon-on-insulator technology.

An etch stop layer 21 with a thickness from about 100 to 2000 Angstroms is deposited on substrate 20 by a CVD or plasma enhanced CVD (PECVD) method and is comprised of silicon nitride, silicon oxynitride, or silicon carbide. A dielectric layer 22 is then formed on the etch stop layer 21 by a CVD, PECVD, or spin-on method and has a thickness between about 3000 and 7000 Angstroms. The dielectric layer 22 is $SiO_2$ or a low k dielectric material such as fluorine doped $SiO_2$, carbon doped $SiO_2$, benzocyclobutene, a polysilsesquioxane, a polyarylether, or a fluorinated polyimide. The dielectric layer 22 may be cured at temperatures up to 600° C. and may be further subjected to a plasma treatment known to those skilled in the art to densify the layer and prevent water uptake. Optionally, a cap layer (not shown) such as silicon carbide or silicon oxynitride may be deposited on the dielectric layer 22 to prevent a subsequent CMP step from scratching or damaging the dielectric layer 22.

A pattern is formed in the dielectric layer 22 by a conventional method that typically involves coating and patterning a photoresist layer (not shown) on the dielectric layer 22 and using the patterned photoresist as an etch mask during a plasma etch transfer of the pattern through the dielectric layer 22 and etch stop layer 21. The photoresist is removed by an ashing step and the substrate is treated with a standard cleaning solution to remove any residues on the dielectric layer 22 or in the openings 23, 24. The openings 23, 24 may be vias or trenches. The opening 23 is formed in region 25 and has a thickness t3 that is equivalent to the combined thickness of the etch stop layer 21 and dielectric layer 22. The opening 23 has a width w1 and a surface area that is preferably greater than about 35% or more of the surface area of region 25. The opening 24 is formed in region 26 and has a thickness t3, a width w2, and a surface area that is less than about 30% of the surface area of region 26. It is understood that other openings (not shown) of different widths and pattern densities may be formed in other regions on substrate 20. The widths w1, w2 may vary from about 0.1 microns to greater than 10 microns.

In an alternative embodiment, a plurality of openings 23 having a width w1 is formed in region 25 and the collective surface area of openings 23 is greater than about 35% of the surface area in the region 25. Likewise, a plurality of openings 24 having a width w2 is formed in the region 26 and the collective surface area of the openings 24 is less than about 30% of the surface area of the region 26. It is understood that when the opening is a trench, some openings may be formed parallel to each other while other openings may be formed perpendicular to each other. In some cases, a trench may be comprised of a 90 degree angle in which one section of a trench is perpendicular to a second section and the two sections are connected at a corner (not shown).

Referring to FIG. 4, a conformal diffusion barrier layer 27 is formed on the sidewalls and bottoms of the openings 23, 24 and has a thickness of about 10 to 1000 Angstroms. The diffusion barrier layer 27 is deposited by a CVD, PECVD, ionized metal plasma (IMP), or ALD method and is preferably Ta or TaN but other materials including Ti, TiN, W, WN, and TaSiN are also acceptable diffusion barrier layers. The diffusion barrier layer 27 has several functions that include the prevention of trace amounts of water or fluorine atoms from oxidizing or corroding subsequently deposited copper layers and preventing copper from diffusing into the dielectric layer 22.

A copper seed layer (not shown) having a thickness of about 100 to 3000 Angstroms is formed on the diffusion barrier layer 27 in order to promote the formation of a first copper layer 28 in the next step. The copper seed layer is deposited by a PVD process or by an IMP sputtering method. The copper seed layer is then incorporated into the first copper layer 28 by a PVD, electroplating, or electroless plating process that deposits an additional 5000 to 15000 Angstrom thickness of copper to form the first copper layer. Copper deposition methods are known to those skilled in the art and are not described herein. The copper seed layer is usually not distinguishable from the first copper seed layer 28. Therefore, the first copper layer 28 is hereafter considered to be a composite layer comprised of a lower copper seed layer and an upper copper layer deposited by a PVD, electroplating, or electroless plating method. In another embodiment, a copper seed layer is not deposited and a first copper layer 28 is deposited directly on the diffusion barrier layer by an electroplating, electroless plating, or PVD method. Note that the first copper layer 28 has an uneven surface with a step height h1 over the larger opening 23 which is greater than the step height h2 over the smaller opening 24.

Figure 5:
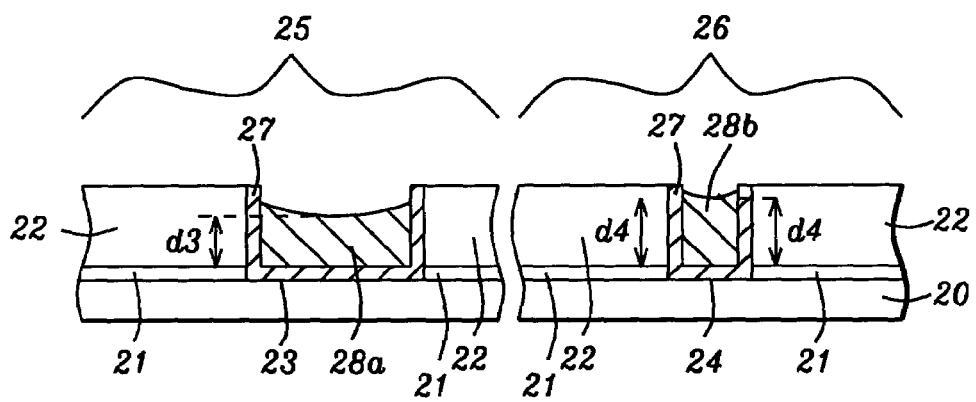

Referring to FIG. 5, a conventional copper CMP process is performed to remove first the copper layer 28 and diffusion barrier layer 27 above the dielectric layer 22. Alternatively, a first CMP step is used to remove the first copper layer 28 and a second CMP step is used to remove the diffusion barrier layer 27 above the dielectric layer 22. In either case, the first copper layer 28 is softer than dielectric layer 22 and diffusion barrier layer 27 and dishing is likely to occur in the first copper layer 28 within the openings 23, 24. The portion of the first copper layer 28 remaining in the opening 23 will hereafter referred to as first copper layer 28a and the portion of the first copper layer 28 remaining in the opening 24 will hereafter be referred to as the first copper layer 28b.

Due to the nature of the CMP process, dishing is more pronounced in the wider opening 23 than in smaller opening 24. As a result, the thickness of the first copper layer 28a is d3 at a point about midway across the opening 23 and is greater than d3 near the diffusion barrier layer 27. Meanwhile, the thickness of the first copper layer 28b is d4 at a point about midway across the opening 24 and is thicker than d4 nearer the diffusion barrier layer 27. Since d3<d4 and sheet resistance (Rs) is inversely proportional to the thickness of a copper layer, the resulting Rs for a copper interconnect comprised of the first copper layer 28a is unacceptably high. Additionally, the difference between the Rs for the first copper layer 28a and the Rs for the first copper layer 28b is large enough to have a deleterious effect on device performance. Likewise, other copper interconnects formed in a region having a copper density of greater than about 35% also have an unacceptably high Rs value. Copper density is defined as the collective copper surface area divided by the total surface area in a given region on substrate 20. A high copper density is considered to be about 35% or more of the total surface area and a low copper density is less than about 30% of the total surface area.

The inventors have discovered a method for reconciling the Rs difference between interconnects formed in low copper density and high copper density regions. The method of the present invention also reduces the Rs for interconnects formed in high copper density regions to a satisfactory level.

Figure 6:
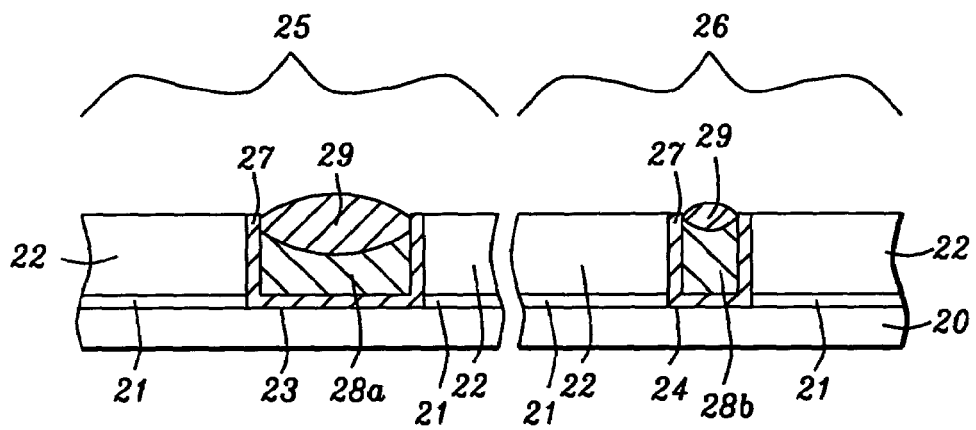

A key feature of the present invention is a selective electroless plating or electrochemical deposition process that deposits a second copper layer on the first copper layers 28a, 28b. Referring to FIG. 6, a second copper layer 29 is selectively deposited on the first copper layers 28a, 28b by an electroless plating process such as the one disclosed in U.S. Pat. No. 5,674,787. In a preferred embodiment, the substrate 20 is treated with an aqueous solution comprised of $CuSO_4.5H_2O$ with a concentration of 10 grams per liter (g/L), a 37% formaldehyde solution in water at a concentration of 15 ml/L, EDTA with a concentration of 28 g/L, tetramethylammonium hydroxide (TMAH) with a concentration of 125 g/L, KOH with a concentration of 18.5 g/L, and 2,2-bipyridine with a concentration of 1.5 g/L. Substrate 20 is preferably treated by dipping into a bath of the aforementioned solution which has a pH in the range of 8 to 13 and preferably about 12.1 and a temperature in the range of 67° C. to 73° C. The rate of second copper layer 29 deposition is typically about 500 Angstroms per minute. The selective electroless plating process continues until the level of second copper layer 29 extends above the level of the dielectric layer 22 and diffusion barrier layer 27. A domed shape upper surface on the second copper layer 29 is typically formed.

An anneal process is performed at this point by placing substrate 20 in an oven at a temperature of about 150° C. to 300° C. with an inert atmosphere such as $N_2$, Ar, or $H_2$ to prevent oxidation of second copper layer 29. The anneal step is continued for a period of about 10 seconds to 5 minutes at a preferred temperature of about 220° C. The anneal step is believed to promote a more uniform grain density ($G_{D1}$) of the first copper layers 28a, 28b and a more uniform grain density ($G_{D2}$) in the second copper layer 29. Due to the nature of the electroless plating process, grain density $G_{D2}$ is usually less than or equal to grain density $G_{D1}$ after the annealing step. The anneal also improves the interface between the first copper layers 28a, 28b and the second copper layer 29.

Figure 7:
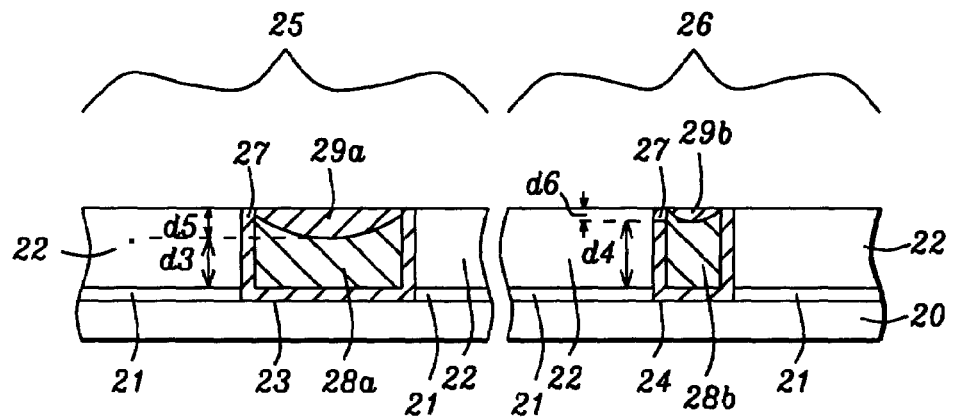

Referring to FIG. 7, a second CMP step which involves a buffing polish is performed in order to planarize the second copper layer 29. The second CMP step is preferably carried out by employing the following CMP conditions: a 2 to 4 psi down force; a table speed of 20 to 50 rpm; a temperature of about 20° C. to 40° C.; and a slurry comprised of $SiO_2$, $H_2O$, and NaOH. Optionally, KOH or $NH_4OH$ may be used in place of NaOH. The polishing process is performed in a commercially available tool such as one available from IPEC or Applied Materials.

As a result, a copper interconnect is formed in the opening 23 and is comprised of a first copper layer 28a and a second copper layer 29a. The interface between the two layers is not likely to be planar and intersects the diffusion barrier layer 27 at a point that is located at or slightly below the top of the diffusion barrier 27 near the surface of the dielectric layer 22. Therefore, the second copper layer 29a has a thickness of d5 near the middle of the opening 23 and a lower thickness near the diffusion barrier 27. Similarly, a copper interconnect is formed in the opening 24 and is comprised of a first copper layer 28b and a second copper layer 29b. The second copper layer 29b has a thickness of d6 near the middle of the opening 24 and a lower thickness near the diffusion barrier layer 27. Preferably, the first copper layer 28a thickness d4 is greater than the thickness d6 and the first copper layer 28b thickness d3 is greater than thickness d5.

Figure 13:
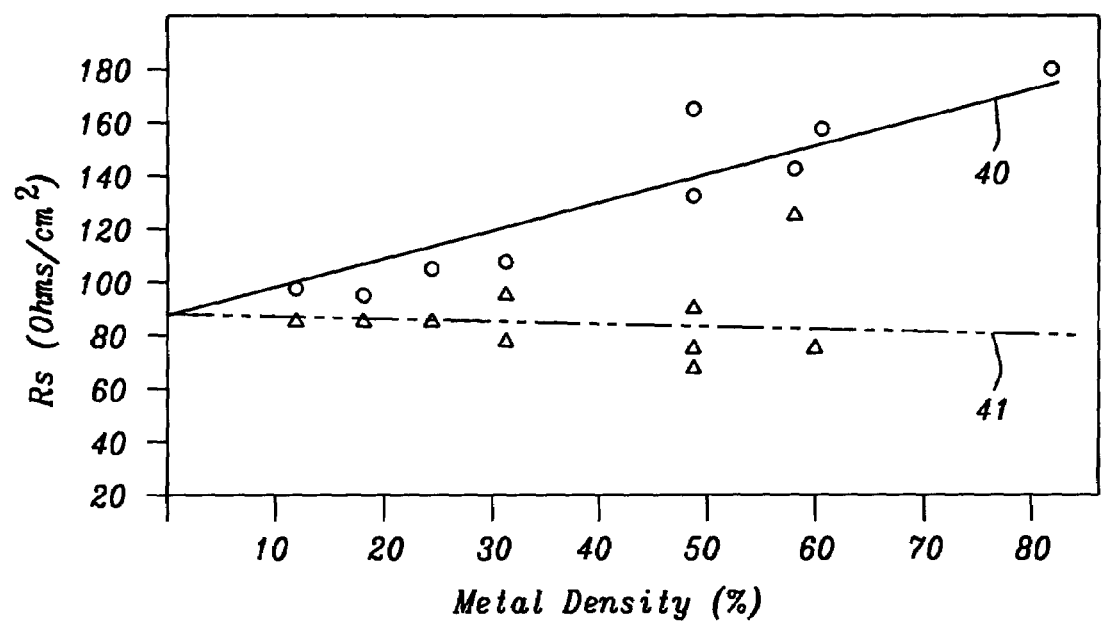
FIG. 13 which is a graph showing the relationship between copper metal density and sheet resistance (Rs) in ohms/cm$^2$ for copper interconnects.

The advantage of the first embodiment of the present invention is illustrated in FIG. 13. A plot of copper density (x-axis) vs. Rs (y-axis) is shown for an interconnect formed by a prior art method represented by dark circles that are fitted to a solid line 40. A similar plot showing results from the present invention is represented by triangles that are fitted to a dashed line 41. The slope of line 40 is steep and indicates a large dependence of Rs on copper density in which high copper density drives a higher Rs. On the other hand, line 41 is almost flat and demonstrates that Rs is nearly independent of copper density. Thus, the present invention is able to minimize Rs for copper interconnects formed in a high density pattern. Furthermore, the Rs variation between interconnects formed in high density regions and those formed in low density regions is reduced substantially. As a result, devices formed with copper interconnects fabricated by the present invention have a higher performance.

A second embodiment of the present invention is depicted in FIGS. 8–12 in which high and low copper density regions are formed on the same substrate and are comprised of copper interconnects that have equivalent width. The collective surface area of interconnects formed in a high density region is greater than about 35% of the area of the region. The collective surface area of interconnects formed in a low density region is less than about 30% of the area of the region.

Figure 8:
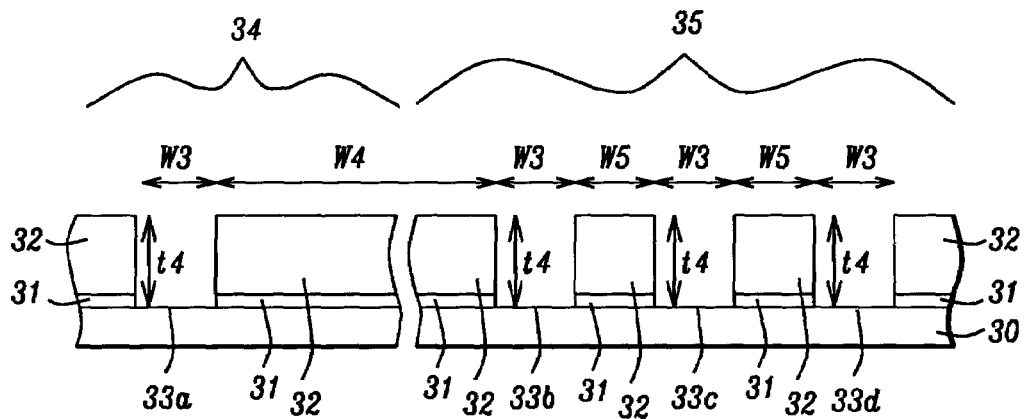
FIGS. 8–12 which are cross-sectional views showing the progressive stages of a damascene scheme in which copper interconnects of different pattern densities are formed according to a second embodiment of the present invention.

Referring to FIG. 8, a substrate 30 is provided that typically includes active and passive devices as well as conductive and dielectric layers that are not shown in order to simplify the drawing. Substrate 30 is preferably silicon but may also be based on silicon-germanium, gallium-arsenide, or silicon-on-insulator technology. An etch stop layer 31 with a thickness from about 100 to 2000 Angstroms is deposited on substrate 30 by a CVD or PECVD method and is comprised of silicon nitride, silicon oxynitride, or silicon carbide. A dielectric layer 32 is then formed on the etch stop layer 31 by a CVD, PECVD, or spin-on method and has a thickness between about 3000 and 7000 Angstroms. The dielectric layer 32 is comprised of $SiO_2$ or a low k dielectric material such as fluorine doped $SiO_2$, carbon doped $SiO_2$, benzocyclobutene, a polyarylether, a fluorinated polyimide, or a polysilsesquioxane. The dielectric layer 32 may be cured at temperatures up to 600° C. and may be further subjected to a plasma treatment known to those skilled in the art to densify the layer. Optionally, a cap layer (not shown) such as silicon carbide or silicon oxynitride may be deposited on the dielectric layer 32 to prevent a subsequent CMP step from scratching or damaging the dielectric layer 32.

A pattern is formed in the dielectric layer 32 by a conventional method that typically involves coating and patterning a photoresist layer (not shown) on the dielectric layer 32 and using the patterned photoresist layer as an etch mask during a plasma etch transfer of the pattern through the dielectric layer 32 and etch stop layer 31. The photoresist layer is removed by an ashing step and the substrate is treated with a standard cleaning solution to remove any residues on the dielectric layer 32 or in openings 33a–33d.

The openings 33a–33d may be vias or trenches or other features that have sidewalls and a bottom. The opening 33a is formed in region 34 and has a thickness t4 that is equivalent to the combined thickness of the etch stop layer 31 and dielectric layer 32. The opening 33a has a width w3 that may vary from about 0.1 microns to several microns. The openings 33b–33d are formed in a region 35 and have a thickness t4 and a width w3. The width w4 between the opening 33a and the opening 33b is typically much larger than w3 and is preferably more than about 2 times larger than w3. Therefore, the opening 33a is in a low pattern density region 34 where the surface area of the opening 33a is less than about 30% of the surface area of region 34. The width w5 between the openings 33b and 33c and between the openings 33c and 33d is similar to w3 and preferably not more than about 1.5 times the size of w3. The region 35 is called a high pattern density region since the collective surface area of the openings 33b–33d is greater than about 35% of the surface area of the region 35. It is understood that other openings of different widths and pattern densities may be formed on substrate 30.

In an alternative embodiment, a plurality of openings 33a is formed in the region 34 and the collective surface area of the openings 33a is less than about 30% of the surface area of the region 34. In addition, a plurality of openings each having a width w3 similar to the openings 33b–33d may be formed in the region 35 and the collective surface area of the plurality of openings is greater than about 35% of the surface area of region 35. Note that when the opening is a trench, some openings may be formed parallel to each other while other openings are formed perpendicular to each other. In some cases, an opening such as a trench may be comprised of a 90 degree angle in which one section of the trench is perpendicular to a second section and the two sections are connected at a corner (not shown).

Figure 9:
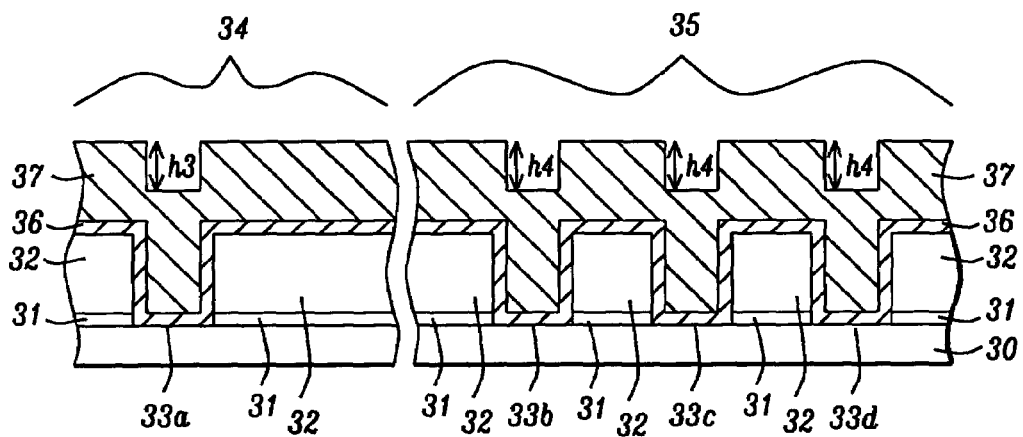

Referring to FIG. 9, a conformal diffusion barrier layer 36 is formed on the sidewalls and bottom of the openings 33a–33d and has a thickness of about 10 to 1000 Angstroms. The diffusion barrier layer 36 is deposited by a CVD, PECVD, IMP, or ALD method and is preferably Ta or TaN but may be comprised of other materials such as one or more of Ti, TiN, W, WN, and TaSiN. The diffusion barrier layer 36 has several functions that include the prevention of trace amounts of water or fluorine atoms from oxidizing or corroding subsequently deposited copper layers and preventing copper from diffusing into the dielectric layer 32.

A copper seed layer (not shown) having a thickness of about 100 to 3000 Angstroms is formed on the diffusion barrier layer 36 in order to promote the formation of a first copper layer 37 in the next step. The copper seed layer is deposited by a PVD process or by an IMP sputtering method. The copper seed layer is then incorporated into the first copper layer 37 by a PVD, electroplating, or electroless plating process that deposits an additional 5000 to 15000 Angstrom thickness of copper to form the first copper layer 37. The copper seed layer is usually not distinguishable from the first copper seed layer 37. Therefore, the first copper layer 37 is hereafter considered to be a composite layer comprised of a lower copper seed layer and an upper copper layer deposited by a PVD, electroplating, or electroless plating method. In another embodiment, a copper seed layer is not deposited and a first copper layer 37 is deposited directly on the diffusion barrier layer by an electroplating or PVD method. Note that the first copper layer 37 has an uneven surface with a step height h3 over the opening 33a and a similar step height h4 over the openings 33b–33d.

Figure 10:
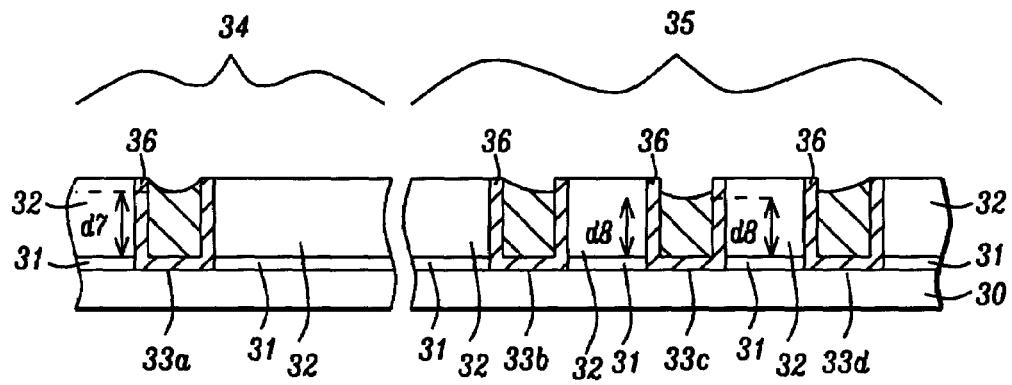

Referring to FIG. 10, a conventional copper CMP process is performed to remove the first copper layer 37 and diffusion barrier layer 36 above the dielectric layer 32. Optionally, a first CMP step is used to remove the first copper layer 37 and a second CMP step is used to remove the diffusion barrier layer 36 above the dielectric layer 32. In either case, the first copper layer 37 is softer than the dielectric layer 32 and diffusion barrier layer 36 and dishing is likely to occur in the first copper layer 37 within the openings 33a–33d. A first copper layer 37a remains in opening 33a and the first copper layers 37b, 37c, 37d remain in openings 33b, 33c, 33d, respectively.

Due to the nature of the CMP process, dishing is less pronounced in the opening 33a in the low density region 34 than in the openings 33b–33d in the high density region 35. As a result, the thickness of the first copper layer 37a is d7 at a point about midway across the opening 33a and is greater than d7 near the diffusion barrier layer 36. Meanwhile, the thickness of the first copper layer 37c is d8 at a point about midway across the opening 33c and is thicker than d8 nearer the diffusion barrier layer 36. The thickness of first copper layers 37b, 37d varies from about d8 as a minimum value to about d7 for a maximum value. Typically, a copper layer near the middle of a dense pattern is eroded more quickly than a copper layer at the edge of a dense pattern.

Since d8<d7 and sheet resistance (Rs) is inversely proportional to the thickness of a copper layer, the resulting Rs for a copper interconnect comprised of the first copper layer 37a is substantially different than the Rs for an interconnect comprised of the first copper layer 37c. The difference between the Rs values for the first copper layer 37a and for the first copper layer 37c is large enough to have a deleterious effect on device performance. Likewise, one or more copper interconnects formed in other high density regions will have a substantially different Rs value than a copper interconnect formed in a low density region. Copper density is defined as the copper surface area divided by the total surface area in a given region on substrate 30. A high copper density is considered to be about 35% or more of the total surface area and a low copper density is less than about 30% of the total surface area in a region.

Figure 11:
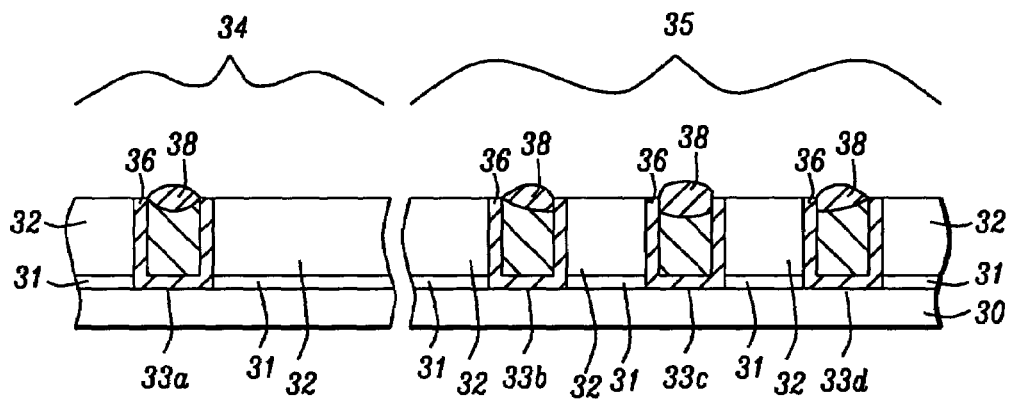

The inventors have discovered a method for reconciling the Rs difference between interconnects formed in low copper density and high copper density regions. A key feature of the present invention is a selective electroless plating process that deposits a second copper layer on the first copper layers 37a–37d. Referring to FIG. 11, a second copper layer 38 is selectively deposited on the first copper layers 37a–37d by an electroless plating process such as the one disclosed in U.S. Pat. No. 5,674,787. In a preferred embodiment, the substrate 30 is treated with an aqueous solution comprised of $CuSO_4.5H_2O$ with a concentration of 10 g/L, a 37% formaldehyde solution in water with a concentration of 15 ml/L, EDTA with a concentration of 28 g/L, KOH with a concentration of 18.5 g/L, tetramethylammonium hydroxide (TMAH) with a concentration of 125 g/L, and 2,2-bipyridine with a concentration of 1.5 g/L. Substrate 30 is preferably treated by dipping into a bath of the aforementioned solution which has a pH in the range of 8 to 13 and preferably about 12.1 and with a temperature in the range of 67° C. to 73° C. The rate of the second copper layer 38 deposition is typically about 500 Angstroms per minute. The selective electroless plating process continues until the level of the second copper layer 38 extends above the level of the dielectric layer 32 and diffusion barrier layer 36. A domed shape upper surface is typically formed on the second copper layer 38.

An anneal process is performed at this point by placing substrate 30 in an oven at a temperature of about 150° C. to 300° C. with an inert atmosphere such as $N_2$, Ar, or $H_2$ to prevent oxidation of the second copper layer 38. The anneal step is continued for a period of about 10 seconds to 5 minutes at a preferred temperature of about 220° C. The anneal step is believed to promote a more uniform grain density ($G_{D1}$) of the first copper layers 37a–37d and a more uniform grain density ($G_{D2}$) in the second copper layer 38. Due to the nature of the electroless plating process, $G_{D2}$ is usually less than or equal to $G_{D1}$ after the annealing step. The anneal step also improves the interface between the first copper layers 37a–37d and the second copper layer 38.

Figure 12:
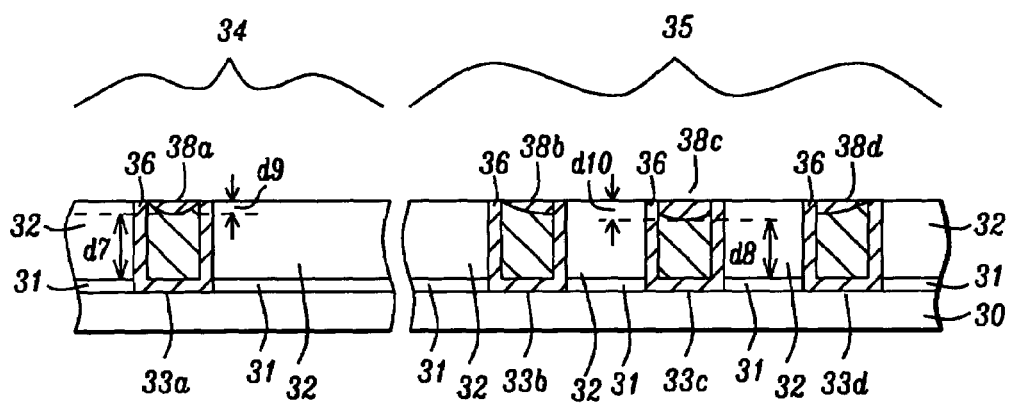

Referring to FIG. 12, a second CMP step which involves a buffing polish is performed in order to planarize the second copper layer 38 which becomes coplanar with the dielectric layer 32. The second CMP step is preferably carried out by employing the following CMP conditions: a 2 to 4 psi down force; a temperature of about 20° C. to 40° C.; a table rotation of 20 to 50 rpm; and a slurry comprised of $SiO_2$, $H_2O$, and NaOH. Optionally, KOH or $NH_4OH$ may be used in place of NaOH. The CMP step is performed in a commercially available tool such as one available from IPEC or Applied Materials.

As a result, a copper interconnect is formed in the opening 33a and is comprised of a first copper layer 37a and a second copper layer 38a. The interface between the two layers is not necessarily planar. Second copper layer 38a has a thickness of d9 near the middle of the opening 33a and a lower thickness near the diffusion barrier layer 36. Similarly, a copper interconnect is formed in the opening 33b and is comprised of a first copper layer 37b and a second copper layer 38b. A third copper interconnect is formed in the opening 33c and includes a first copper layer 37c and a second copper layer 38c. A fourth copper interconnect is formed in the opening 33d and includes a first copper layer 37d and a second copper layer 38d. There is a thickness d10 for second copper layer 38c near the middle of opening 33c and a lower thickness near diffusion barrier layer 36. Second copper layers 38b and 38d have a thickness that varies from about d10 to about d9. Preferably, the first copper layer 37a thickness d7 is greater than the thickness d9 and the first copper layer 37c thickness d8 is greater than thickness d10.

The advantage of the second embodiment of the present invention is illustrated in FIG. 13. A plot of copper density (x-axis) vs. Rs (y-axis) is shown for an interconnect fabricated by a prior art method represented by dark circles that are fitted to a solid line 40. A similar plot showing results from the present invention is represented by triangles that are fitted to a dashed line 41. The slope of line 40 is steep and indicates a large dependence of Rs on copper density in which high copper density drives a higher Rs. On the other hand, line 41 is almost flat and demonstrates that Rs is nearly independent of copper density. Thus, the present invention is able to minimize the Rs variation between interconnects formed in high density regions and those formed in low density regions to an acceptable level. As a result, devices formed with copper interconnects fabricated by the present invention have a higher performance.

In alternative embodiment, the copper interconnect pattern described in the first embodiment and the copper interconnect pattern described in the second embodiment may be formed on the same substrate. The present invention is equally effective in forming uniformly thick interconnects that have a uniform Rs on substrates with high density patterns involving openings having different widths and varying distances of separation from one another. Furthermore, the present invention is effective in forming copper interconnects with uniform Rs values in openings in a plurality of high density regions and in a plurality of low density regions on a substrate where each of the regions may have a different % pattern density value.

Figure 14:
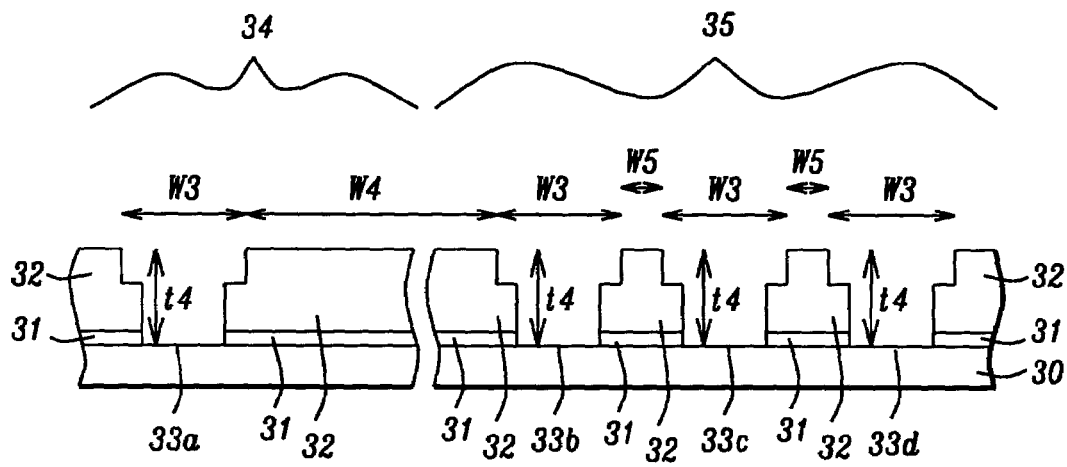
FIGS. 14–15 are cross-sectional views showing a method of forming a copper interconnect having two copper layers according to a third embodiment of the present invention.
Figure 15:
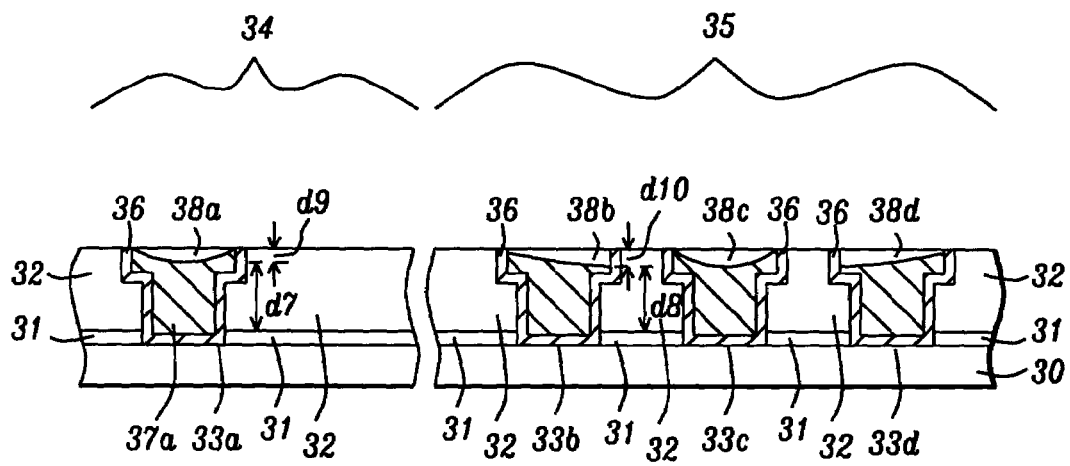

A third embodiment of the present invention involves a dual damascene scheme in which a metal interconnect is fabricated in an opening comprised of a trench formed above a via as depicted in FIGS. 14–15. Referring to FIG. 14, a pattern of via openings is formed in a dielectric layer 32 as described previously. For example, the process in the second embodiment that forms openings 33a–33d is followed through the step of etching via openings through the dielectric layer 32 and stops on the etch stop layer 31. A conventional sequence of steps involving photoresist patterning and etching known to those skilled in the art is followed to generate a trench above each via in the openings 33a–33d. Subsequently, the etch stop layer 31 is removed at the bottom of the openings 33a–33d. Optionally, one trench may be formed above two or more openings in the high density region 35. Obviously, other design variations appreciated by those skilled in the art are possible in the embodiment where a plurality of openings are formed in the low density region 34 and a plurality of openings are formed in the high density region 35. Note that width w3 of the openings 33a–33d is typically larger relative to w4 and w5 in the third embodiment than in the second embodiment because the width of a trench is larger than an underlying via.

Referring to FIG. 15, a diffusion barrier layer 36, a copper seed layer (not shown), the first copper layers 37a, 37b, 37c, 37d, and the second copper layers 38a, 38b, 38c, 38b in the openings 33a, 33b, 33c, 33d, respectively, are formed by the same series of steps that was previously described in the second embodiment. The first copper layers 37a, 37b, 37c, 37d completely fill the via portion of openings 33a, 33b, 33c, 33d, respectively. Second copper layer 38a has a thickness of d9 near the middle of the opening 33a and a lower thickness near the diffusion barrier 36. The second copper layer has a thickness d10 near the middle of the opening 33c and a lower thickness near the diffusion barrier layer 36. The second copper layers 38b and 38d have a thickness that varies from about d10 to about d9. Preferably, the first copper layer 37a thickness d7 is greater than the thickness d9 and the first copper layer 37c thickness d8 is greater than the thickness d10. Furthermore, $G_{D2}$ for the second copper layers 38a–38d is usually less than or equal to $G_{D1}$ for the first copper layers 37a–37d. The advantages of a metal interconnect formed in the third embodiment are the same as those described earlier for the metal interconnects formed according to the first and second embodiments.

The present invention is also a copper interconnect structure formed in an opening that is in bounded on its vertical sides by one or more dielectric layers on a substrate. An exemplary copper interconnect structure is pictured in FIG. 7 and is comprised of a first copper layer 28a formed in an opening 23 and a second copper layer 29a formed above first copper layer 28a. The opening is bounded on the bottom by a planar substrate 20. Optionally, a conformal diffusion barrier layer 27 is formed on the sides and bottom of the opening. The vertical sides of opening 23 are bounded by an etch stop layer 21 formed on substrate 20 and a dielectric layer 22 formed on etch stop layer 21. The opening 23 may be a trench, a via, or another feature having sidewalls and a bottom. The first copper layer 28a and the second copper layer 29a have an equal width that ranges from about 0.1 microns to several microns. The combined thickness of the first copper layer 28a and the second copper layer 29a is from about 3000 to 7000 Angstroms.

The first copper layer 28a has vertical sidewalls, a planar bottom, and a top surface that has a concave shape. First copper layer 28a has a minimum thickness d3 from the middle of the top surface to the bottom and a maximum thickness along a vertical sidewall. Note that the top surface does not necessarily intersect the vertical sidewall at the top of the sidewall but may intersect with the sidewall at a point below the level of the dielectric layer 22. The second copper layer 29a has vertical sidewalls, a top surface that is substantially planar, and a convex bottom surface that forms an interface with the concave top surface of the first copper layer 28a. The top surface of the second copper layer 29a is essentially coplanar with the surface of the dielectric layer 22. Second copper layer 29a has a maximum thickness d5 from the middle of the bottom surface to the middle of its top surface and a minimum thickness along a vertical sidewall. The intersection of the bottom surface with a vertical sidewall may be at a point below the level of the surface of the dielectric layer 22. Preferably, d3 is greater than d5. Furthermore, the first copper layer 28a has a grain density ($G_{D1}$) that is greater than or equal to the grain density ($G_{D2}$) of the second copper layer 29a.

The copper interconnect comprised of the first copper layer 28a and the second copper layer 29a is formed in the region 25 on substrate 20. There may be other copper interconnects formed on the same substrate 20. For example, a second interconnect comprised of the first copper layer 28b and the second copper layer 29b is formed in the opening 24 in a region 26 and has a width that may not be equivalent to that of the first copper layer 28a and the second copper layer 29a. However, the minimum thickness d4 of the first copper layer 28b is greater than the maximum thickness d6 of the second copper layer 29b. Second copper layer 29b has a substantially planar top surface that is essentially coplanar with the top surface of the dielectric layer 22. The grain density ($G_{D1}$) of the first copper layer 28b is equivalent to that of the first copper layer 28a and the grain density ($G_{D2}$) of the second copper layer 29b is equivalent to that of the second copper layer 29a.

In an alternative embodiment, the present invention is a copper interconnect structure fabricated in an opening comprised of a trench formed above a via that is bounded on its vertical sides by one or more dielectric layers on a substrate. The trench has a width that is greater than the width of the via. An exemplary copper interconnect structure is pictured in FIG. 15 and is comprised of a first copper layer 37a formed in an opening 33a and a second copper layer 38a formed above the first copper layer 37a. The opening is bounded on the bottom by a planar substrate 30. Optionally, a conformal diffusion barrier layer 36 is formed on the sides and bottom of the opening. The vertical sides of the opening 33a are bounded by an etch stop layer 31 formed on substrate 30 and a dielectric layer 32 formed on the etch stop layer 31. The first copper layer 37a fills the via portion of the opening 33a and extends into the trench portion of the opening. Within the trench portion of the opening 33a, the first copper layer 37a and the second copper layer 38a have an equal width that ranges from about 0.1 microns to several microns. The combined thickness of the first copper layer 37a and the second copper layer 38a is from about 3000 to 7000 Angstroms.

The first copper layer 37a has vertical sidewalls, a planar bottom, and a top surface that has a concave shape within the trench portion of the opening 33a. First copper layer 37a has a minimum thickness d7 from the middle of its top surface to its bottom in the opening 33a. Note that the top surface does not necessarily intersect the vertical sidewall at the top of the sidewall but may intersect the sidewall at a point below the level of the top surface of the dielectric layer 32. The second copper layer 38a has vertical sidewalls, a top surface that is substantially planar, and a convex bottom surface that forms an interface with the concave top surface of the first copper layer 37a in the trench portion of the opening 33a. The top surface of the second copper layer 38a is essentially coplanar with the top surface of the dielectric layer 32. Second copper layer 38a has a maximum thickness d9 from the middle of its bottom surface to the middle of its top surface and a minimum thickness along a vertical sidewall. The intersection of the bottom surface with a vertical sidewall may be at a point below the level of the top surface of the dielectric layer 32. Preferably, d7 is greater than d9. Furthermore, the first copper layer 37a has a grain density ($G_{D1}$) that is greater than or equal to the grain density ($G_{D2}$) of the second copper layer 38a.

The advantage of the copper interconnect comprised of the first copper layer and a second copper layer according to an embodiment of this invention is that the combined thickness of the two copper layers is independent of the width of the interconnect and is not dependent on the distance to neighboring copper interconnects. Moreover, the interconnect exhibits a Rs that is within specifications is nearly independent of the width of the interconnect and of the pattern density in the region in which it is formed.

While this invention has been particularly shown and described with reference to, the preferred embodiments thereof, it will be understood by those skilled in the art that various changes in form and details may be made without departing from the spirit and scope of this invention. For instance, the copper interconnect structure may be formed on a substrate comprised of another metal interconnect. The first copper layer in the copper interconnect forms an electrical contact with the underlying metal interconnect.

We claim:

1. A copper interconnect structure in a semiconductor device, comprising:
   (a) a first copper layer having first substantially vertical sidewalls, a planar bottom, and a concave top surface formed in an opening in a dielectric layer on a substrate, said first copper layer having a first thickness and a grain density $G_{D1}$, said first substantially vertical sidewalls disposed along sides of said opening; and
   (b) a second copper layer disposed in said opening and having second substantially vertical sidewalls disposed along said sides of said opening and directly above and co-linear with said first substantially vertical sidewalls, a substantially planar top surface that is about coplanar with the top of said dielectric layer, and a convex bottom surface that forms an interface with said concave top surface of said first copper layer, said second copper layer having a second thickness and a grain density $G_{D2}$.

2. The copper interconnect of claim 1 wherein said substrate is further comprised of an upper etch stop layer and the opening extends through said etch stop layer.

3. The copper interconnect of claim 1 wherein said dielectric layer is comprised of $SiO_2$, borophosphosilicate glass, or a low k dielectric material that is fluorine doped $SiO_2$, carbon doped $SiO_2$, a poly(arylether), a polysilsesquioxane, benzocyclobutene, or a fluorinated polyimide.

4. The copper interconnect structure of claim 1 wherein the combined thickness of said first copper layer and said second copper layer is from about 3000 to 7000 Angstroms.

5. The copper interconnect structure of claim 1 further comprised of a conformal diffusion barrier layer formed in said opening along the first substantially vertical sidewalls and bottom of said first copper layer and along the second substantially vertical sidewalls of said second copper layer.

6. The copper interconnect structure of claim 1 wherein the width of said first copper layer and the width of said second copper layer are substantially equal and lie within a range of about 0.1 microns to over 10 microns.

7. The copper interconnect structure of claim 1 wherein said copper interconnect has a sheet resistance that is nearly independent of the width of said first copper layer and the width of said second copper layer.

8. The copper interconnect structure of claim 1 wherein said opening is part of a pattern that includes a plurality of other openings having a pattern density and said copper interconnect has a sheet resistance (Rs) that is nearly independent of said pattern density.

9. The copper interconnect structure of claim 1 wherein the first thickness of said first copper layer is equal to or greater than the second thickness of said second copper layer.

10. The copper interconnect structure of claim 1 wherein $G_{D1}$ is greater than or equal to $G_{D2}$.

11. The copper interconnect structure of claim 1 wherein said substrate is comprised of a metal layer and said first copper layer of said copper interconnect is formed above said metal layer and forms an electrical contact to said metal layer.

12. A copper interconnect formed in an opening comprised of a trench formed above a via in a dielectric layer on a substrate, said trench having trench sidewalls, a bottom, and a width that is larger than the width of said via and said via having via sidewalls and a bottom, comprising:
  (a) a first copper layer that fills said via and extends into said trench, said first copper layer having lower substantially vertical sidewalls and a planar bottom in said via and first substantially vertical sidewalls that are disposed along said trench sidewalls and a planar bottom in said trench, a concave top surface formed within the trench, a first thickness, and a grain density $G_{D1}$; and
  (b) a second copper layer formed within the trench portion of said opening and having second substantially vertical sidewalls that are disposed along said trench sidewalls, a substantially planar top surface that is about coplanar with the top of said dielectric layer and the top of the trench, and a convex bottom surface that forms an interface with the concave top surface of said first copper layer, said second copper layer having a second thickness and a grain density $G_{D2}$.

wherein $G_{D1}$ is greater than $G_{D2}$.

13. The copper interconnect of claim 12 wherein said substrate is further comprised of an upper etch stop layer and the via extends through said etch stop layer.

14. The copper interconnect of claim 12 wherein the combined thickness of said first copper layer and said second copper layer is from about 3000 to 7000 Angstroms.

15. The copper interconnect of claim 12 further comprised of a conformal diffusion barrier layer formed along the lower substantially vertical sidewalls and first substantially vertical sidewalls of the first copper layer and the second substantially vertical sidewalls of the second copper layer and along the bottom of the first copper layer in the trench and via.

16. The copper interconnect of claim 12 wherein said copper interconnect has a sheet resistance that is nearly independent of the width of the trench.

17. The copper interconnect of claim 12 wherein said opening is part of a pattern that includes a plurality of other openings having a pattern density and said copper interconnect has a sheet resistance (Rs) that is nearly independent of said pattern density.

18. The copper interconnect of claim 12 wherein the first thickness of said first copper layer is equal to or greater than the second thickness of said second copper layer.

19. The copper interconnect structure of claim 1 wherein said first substantially vertical sidewalls are conterminous with said sides of said opening and said second substantially vertical sidewalls are conterminous with said sides of said opening.

20. The copper, interconnect structure of claim 12 wherein said first substantially vertical sidewalls are conterminous with said trench sidewalls and said second substantially vertical sidewalls are conterminous with said trench sidewalls.

* * * * *